United States Patent
Egawa

(10) Patent No.: US 6,426,554 B1
(45) Date of Patent: Jul. 30, 2002

(54) SEMICONDUCTOR DEVICE

(75) Inventor: Yoshimi Egawa, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 09/519,857

(22) Filed: Mar. 6, 2000

(30) Foreign Application Priority Data

Nov. 15, 1999 (JP) .......................................... 11-323510

(51) Int. Cl.[7] .......................... H01L 23/12; H01L 23/48; H01L 23/28; H01L 23/495; H01L 23/02
(52) U.S. Cl. .......................... 257/731; 257/772; 257/787; 257/666; 257/678; 257/696
(58) Field of Search ................................ 257/731, 684, 257/678, 668, 778, 787, 676, 666, 696, 772

(56) References Cited

U.S. PATENT DOCUMENTS

| | | | |
|---|---|---|---|
| 5,918,113 A | * 6/1999 | Higashi et al. | 438/119 |
| 5,920,118 A | * 7/1999 | Kong | 257/684 |
| 5,999,413 A | * 12/1999 | Ohuchi et al. | 361/772 |
| 6,096,577 A | * 8/2000 | Hashimoto | 438/116 |
| 6,130,483 A | * 10/2000 | Shizuki et al. | 257/778 |
| 6,163,069 A | * 12/2000 | Oohira et al. | 257/684 |
| 6,204,564 B1 | * 3/2001 | Miyata et al. | 257/48 |
| 6,262,480 B1 | * 7/2001 | Ferri et al. | 257/706 |
| 6,268,652 B1 | * 7/2001 | Kimura | 257/696 |
| 6,271,581 B2 | * 8/2001 | Huang et al. | 257/666 |
| 6,281,567 B1 | * 8/2001 | Murayama et al. | 257/676 |
| 6,281,568 B1 | * 8/2001 | Glenn et al. | 257/684 |
| 6,288,851 B1 | * 9/2001 | Tomita | 359/809 |
| 6,300,161 B1 | * 10/2001 | Goetz et al. | 438/106 |

FOREIGN PATENT DOCUMENTS

| | | | |
|---|---|---|---|
| JP | 0454150 A1 | * | 10/1991 |
| JP | 406053347 A | * | 2/1994 |
| JP | 6-203642 | | 7/1994 |
| JP | 406188325 A | * | 7/1994 |
| JP | 406196580 A | * | 7/1994 |
| JP | 406204355 A | * | 7/1994 |
| JP | 10-56099 | | 2/1998 |
| JP | 10-107072 | | 4/1998 |

* cited by examiner

*Primary Examiner*—Matthew Smith
*Assistant Examiner*—Chuong Anh Luu
(74) *Attorney, Agent, or Firm*—Volentine Francos, PLLC

(57) ABSTRACT

A semiconductor device includes a semiconductor chip having a mounting surface with connecting pads mounted thereon, and a film having a gluing surface facing the mounting surface of the chip and a mounting surface for mounting a circuit board on a surface opposite the gluing surface. The circuit board has connecting pads mounted thereon. On the mounting surface of the film, a wiring pattern is formed with connecting terminals connected to the connecting pads of the circuit board. The film is an anisotropically conductive film and exhibits conductivity at local areas when subjected to pressure between the wiring pattern and the connecting pads of the semiconductor chip. The gluing surface of the film is attached solidly to the semiconductor chip, wherein the film maintains conductivity in view of a cooling process after heating.

16 Claims, 5 Drawing Sheets

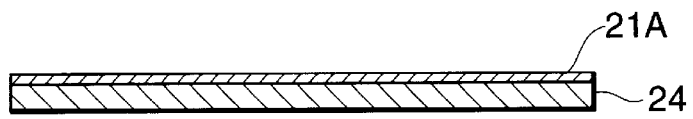
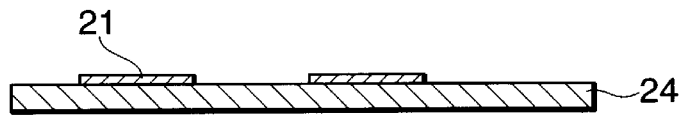
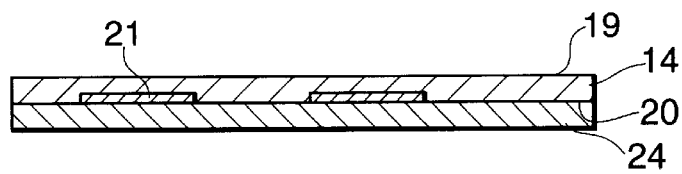
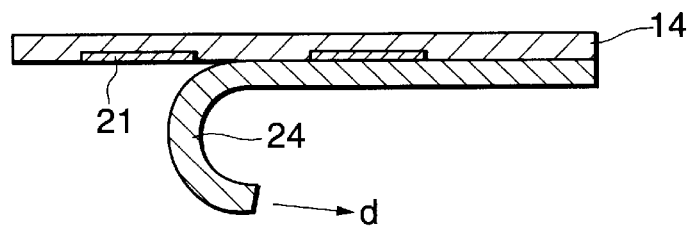
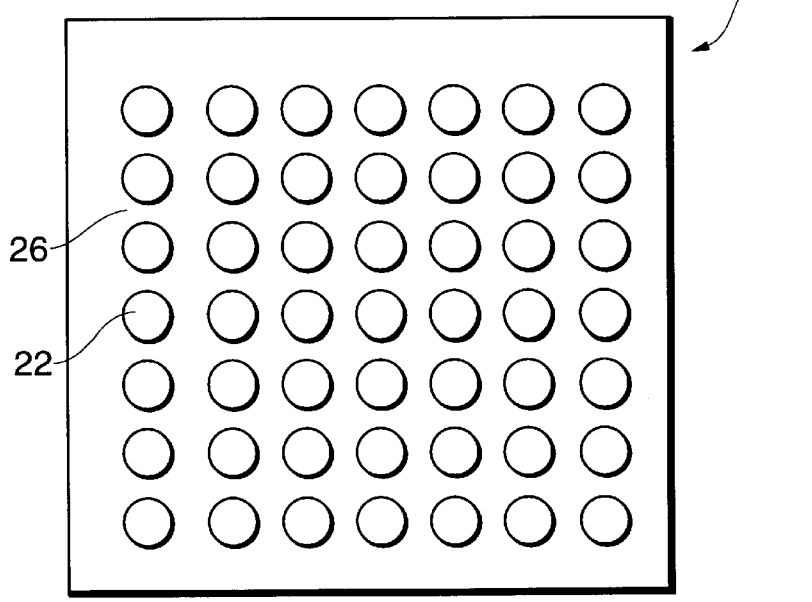

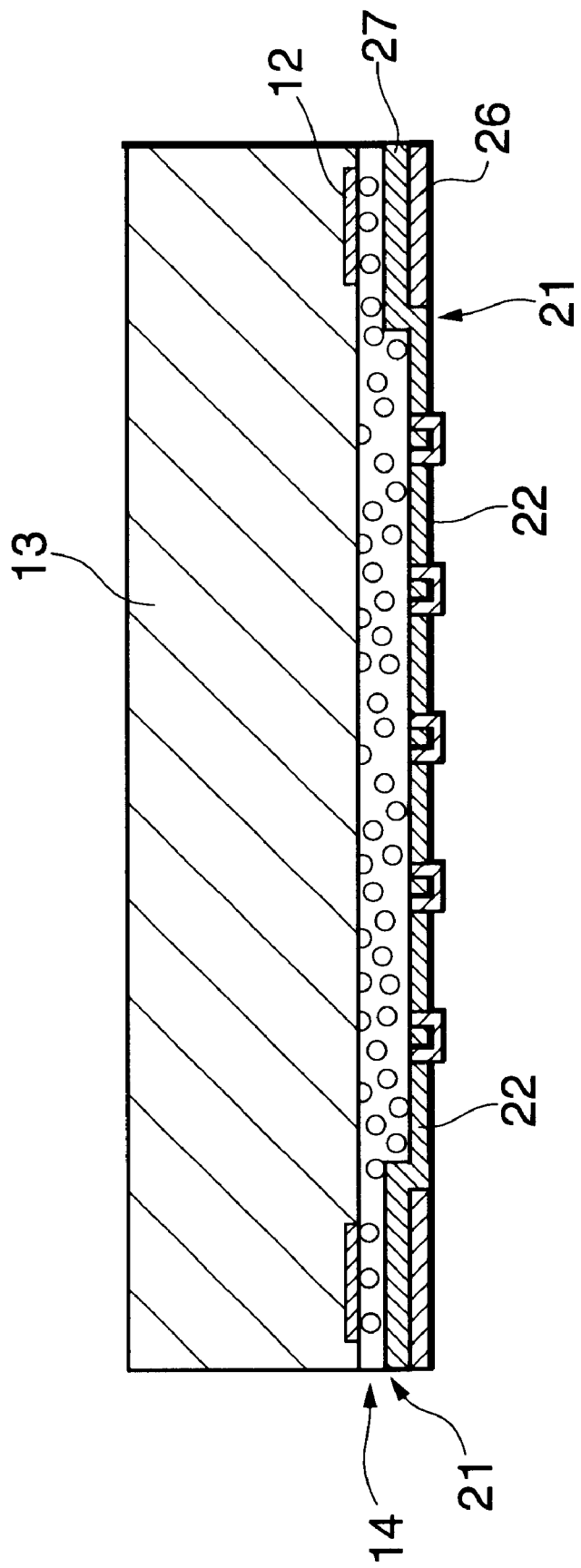

SEMICONDUCTOR DEVICE

BACKGROUND OF THE INVENTION

1. Field of the Invention

The present invention relates to an integrated circuit (IC) semiconductor device, and more particularly to a semiconductor device suitable for use as a so-called chip size package.

2. Description of the Related Art

A chip size package (hereafter referred to as a CSP) is an example of IC semiconductor device packages. In this CSP, in order to facilitate handling of a semiconductor chip, a semiconductor chip having a mounting surface, on which connecting pads are mounted, is often combined as one body with a mounting board called an interposer made of a synthetic resin material, such as a glass epoxy or a polyimide, or a ceramic.

On the upper surface of the mounting board, there are provided connecting terminals to be connected to the connecting pads on the chip, and the corresponding terminals are connected through bumps to the connecting pads on the chip. On the lower surface of the mounting board, mounting terminals are provided to correspond to the connecting terminals connected through the bumps to the chip.

The space between the upper surface of the mounting board and the mounting surface of the semiconductor chip is filled with a resin material called an underfill for reinforcement and dust-proofing and water-proofing. As the mounting terminals on the mounting board are connected through solder balls to the circuit on a printed circuit board, the CSP is fixed to the printed circuit board by the mounting terminals. Thus, the CSP is mounted on the printed circuit board.

As the space for the connecting pads mounted on the mounting surface of the semiconductor chip decreases as the down-sizing of the semiconductor chip progresses, the above-mentioned bumps that lie between the semiconductor chip and the mounting board decrease in size. As the bumps decrease in size, the space between the semiconductor chip and the mounting board filled with an underfill decreases, so that secure filling of the underfill becomes difficult.

An object of the present invention is to provide a semiconductor device suitable for down-sizing of the semiconductor chip and also suitable for use as a CSP.

An additional object of the present invention is to provide semicoductor packaging with a simpler in structure.

SUMMARY OF THE INVENTION

The present invention adopts a following structure to achieve the above objects.

According to the present invention, there is provided a semiconductor device comprising a semiconductor. chip having a mounting surface with connecting pads mounted thereon; and a film having a gluing surface facing said mounting surface and a mounting surface to a circuit board on a surface opposite said gluing surface, said latter mounting surface having connecting pads mounted thereon, wherein said film has on said mounting surface of said film a wiring pattern with connecting terminals to said connecting pads on said circuit board, wherein said film is an anisotropically conductive film to exhibit conductivity at areas when subjected to a pressure between said wiring pattern and said connecting pads of said semiconductor chip, and wherein said gluing surface of said film is attached solidly to said semiconductor chip with said film kept to exhibit the conductivity by a hardening process of the film.

According to the present invention, the semiconductor chip is formed as a combined body with the conductive film attached solidly to the mounting surface of the semiconductor chip. Thus, the newly configured semiconductor chip has been reinforced by the conductive film and obviates the need for an interposer as in the prior art and is easy to handle.

When the semiconductor device is mounted, the connecting terminals of the wiring pattern on the mounting surface of the conductive film are connected through solder balls as in the prior art to a desired circuit board. In this manner, the semiconductor device is mounted on the circuit board. The mounting surface of the semiconductor chip is covered with the conductive film and is protected thereby. It is unnecessary to perform filling with a resin material as in the prior art.

The above-mentioned semiconductor device may be applied to types of packages other than the CSP, but the most suitable application is in a CSP.

The mounting surface of the film except for the connecting terminals of the wiring pattern may be covered with an insulating film.

This insulating film serves to improve the waterproofing performance of the package.

The connecting terminals of the wiring pattern as connection ends to the connecting pads on the circuit board may be formed as convex portions extending towards the circuit board. The connecting terminals formed as convex portions ensure secure connection when the connecting terminals are attached solidly to the corresponding connecting pads on the circuit board through the intermediary of solder.

The parts of the wiring pattern which correspond to the connecting pads on the semiconductor chip through the intermediary of the above-mentioned film may be provided with raised portions so as to be closer to the semiconductor chip to apply a pressure to the above-mentioned intervening film.

The wiring pattern formed on the above-mentioned film may be formed by transferring the wiring pattern of a conductive layer from a separable support film to the mounting surface of the anisotropically conductive film.

As an alternative to the method just mentioned, the wiring pattern may be formed by patterning the conductive layer formed on the mounting surface of the above-mentioned film.

The anisotropically conductive film may be obtained by preparing conductive particles formed by plating fine particles of a synthetic resin material, for example, with a metal such as gold, or preparing conductive particles of silver, nickel or gold, and dispersing the conductive particles in an epoxy thermosetting or thermoplastic synthetic resin material, for example.

BRIEF DESCRIPTION OF THE DRAWINGS

FIG. 3(*a*), FIG. 3(*b*), FIG. 3(*c*) and FIG. 3(*d*) are sectional views showing the method of forming a wiring pattern according to the present invention;

FIG. 4 is a plan view showing an insulating film according to the present invention as shown in FIG. 1;

FIG. 5 is a drawing, similar to the one in FIG. 1, which shows another embodiment according to the present invention.

DESCRIPTION OF EMBODIMENTS

The present invention will be described in detail with reference to embodiments depicted in the accompanying drawings.

<Embodiment 1>

Figure 1:
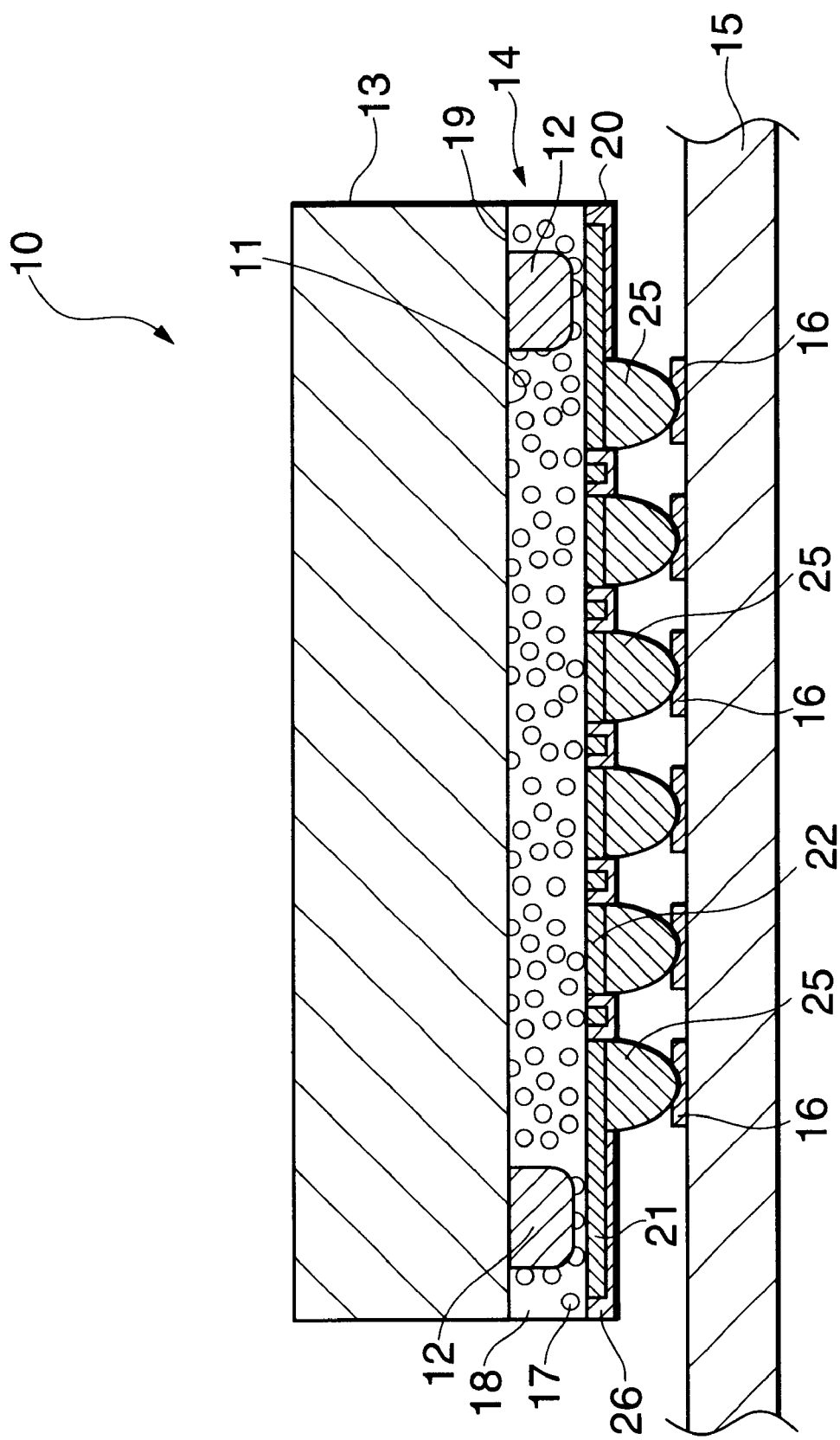
FIG. 1 is a sectional view of a first embodiment of a semiconductor device according to the present invention.

FIG. 1 is a sectional view showing an example in which a semiconductor device according to the present invention is applied to a so-called chip size package (CSP).

A semiconductor device 10 according to the present invention includes a semiconductor IC (integrated circuit) chip 13 provided on its bottom surface 11 as a mounting surface with a plurality of Al electrodes 12, for example, like in the prior art.

In the CSP 10 according to the present invention, the semiconductor chip 13 is mounted to a printed circuit board 15, such as one in an electric appliance, through an anisotropically conductive film 14 attached solidly to the bottom surface thereof. Provided on the upper surface of the circuit board 15 are a plurality of well-known connecting pads 16 connected to the corresponding electrodes 12.

The electrodes 12 on the semiconductor chip 13 are formed extending downwardly from the mounting surface 11. The electrodes 12 are covered with the anisotropically conductive film 14, which is attached solidly to the mounting surface 11.

The anisotropically conductive film 14 includes a film main body 18 made of a thermoplastic or thermosetting synthetic resin material in which conductive nickel particles 17 of particle size of several microns in diameter, for example, are dispersed. When acted on by a strong pressure in the through-thickness direction, the anisotropically conductive film 14 allows a local current conduction in the through-thickness direction only in the area subjected to the strong pressure, by the conducting action of the conductive particles.

For the conductive particles 17, in place of the above-mentioned nickel particles, it is possible to adopt conductive particles of a synthetic resin material, for example, which are plated with a metal such as gold or conductive particles of silver or gold.

A wiring pattern 21 is formed on one surface 20 of the anisotropically conductive film 14 opposite the other surface 19 as a gluing surface to the semiconductor chip 13.

Figure 2:
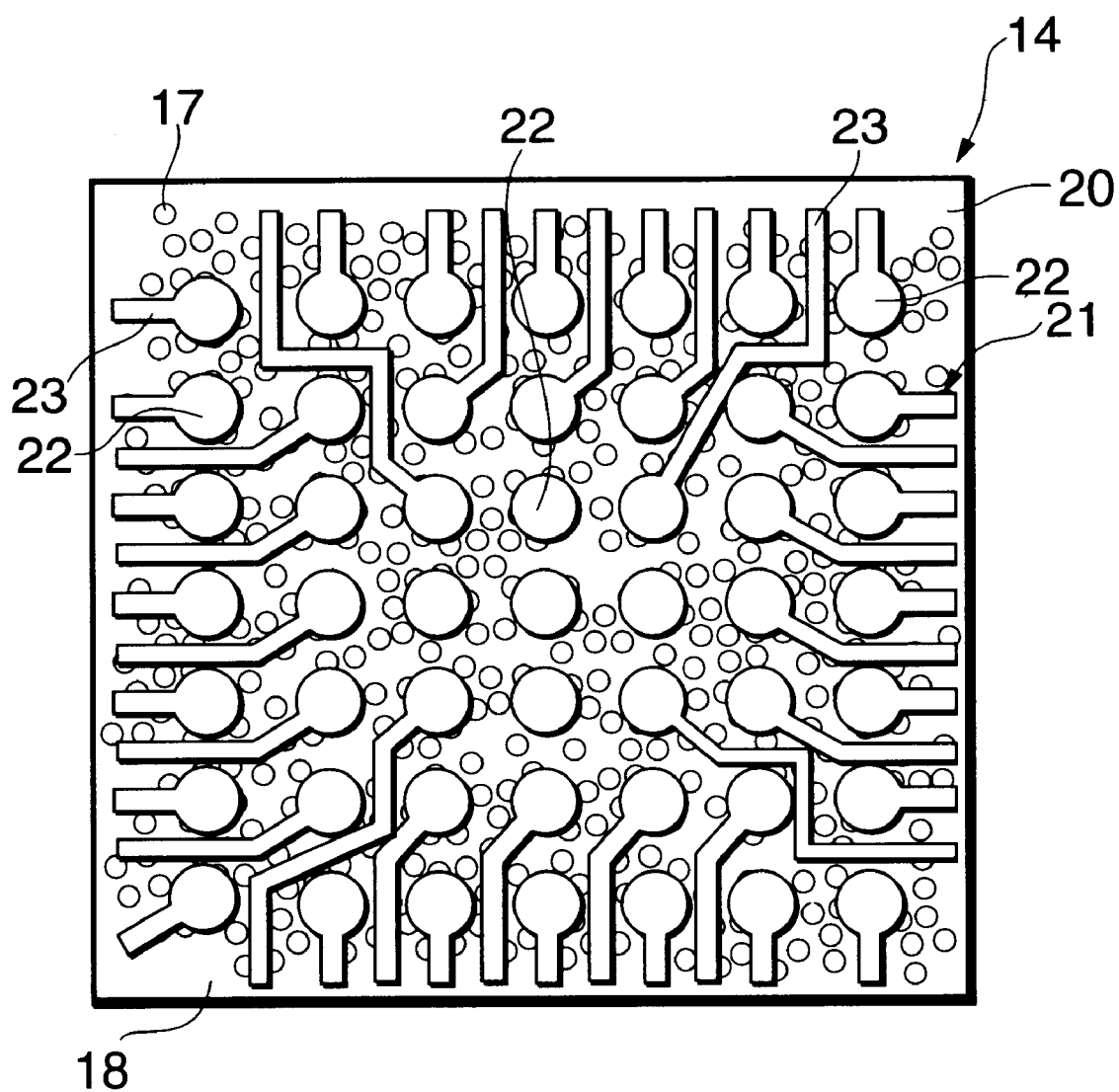
FIG. 2 is a plan view of a wiring pattern according to the present invention as shown in FIG. 1.

As shown in FIG. 2, the wiring pattern 21 has a plurality of connecting terminals 22 formed to correspond to the connecting pads 16 on the circuit board 15 in FIG. 1. Excepting those connecting terminals 22 having the corresponding electrodes 12 of the semiconductor chip 13 located directly above them, the other connecting terminals 22 have extensions 23 provided to extend to under the electrodes 12 of the semiconductor chip 13 and to correspond to the connecting pads 16 that respectively correspond to the other connecting terminals 22.

This wiring pattern 21 may be formed directly on the film main body 18, for example, by forming a conductive layer 21A (FIG. 3(a)) of copper or nickel, for example, on the surface 20 of the film main body 18 and subsequent patterning by a well-known photolithographic technique.

Instead of forming directly on the film main body 18, the wiring pattern 21 may be formed on the anisotropically conductive film 14 by a method illustrated in FIGS. 3(a), 3(b), 3(c) and 3(d).

In the method shown in FIGS. 3, as is known from FIG. 3(a), a conductive layer 21A same as the one mentioned above is formed on a sticky support film 24. The conductive layer 21A is etched by a photolithographic technique same as the one mentioned above. By removal of unwanted portions from the conductive layer 21A, the wiring pattern 21 same as was mentioned above is formed on the support film 24 as shown in FIG. 3(b). Thereafter, an anisotropically conductive film 14 is formed on the support film 24 on which the wiring pattern 21 has been formed as shown in FIG. 3(c). Subsequently, by peeling the support film 24 off the anisotropically conductive film 14, the wiring pattern 21 is formed on the anisotropically conductive film 14 as shown in FIG. 3(d).

Instead of forming the anisotropically conductive film 14 on the support film 24, another method can be performed as follows. An anisotropically conductive film 14, which has been formed in advance, is heated to about 100° C., for example, to keep the film main body 18 of the anisotropically conductive film in a half-molten state. The wiring pattern 21 on the support film 24 is temporarily pressed against the half-molten film main body 18, and after this the support film 24 can be peeled off in the same manner as in the example in FIG. 3.

Referring back to FIG. 1, the anisotropically conductive film 14 having the wiring pattern 21 formed on the mounting surface thereof is positioned with a gluing surface 19, opposite the mounting surface 20, facing the semiconductor chip 13. While pressed on both surfaces by the mounting surface 11 of the semiconductor chip 13 and the wiring pattern 21, the anisotropically conductive film 14 is heated and then cooled to an ordinary temperature.

Each portion of the anisotropically conductive film which is located between an electrode 12 protruding from the mounting surface 11 of the semiconductor chip 13, on one hand, and that part of the wiring pattern 21 corresponding to the electrode 12, on the other hand, is subjected to a strong pressure by the above-mentioned pressing, and as the result, local conduction occurs between the electrode 12 and the corresponding part of the wiring pattern 21. Thus, the electrodes 12 and the corresponding parts of the wiring pattern 21 are electrically connected by the pressing mentioned above when the anisotropically conductive film 14 becomes solid.

As the result, the anisotropically conductive film 14 is attached solidly to the semiconductor chip 13 with the wiring pattern 21 thereon electrically connected to the corresponding electrodes 12.

When the semiconductor chip 13 with the anisotropically conductive film 14 attached thereto is mounted, the connecting terminals 22 of the wiring pattern 21 on the mounting surface 20 of the anisotropically conductive film 14 are connected to the corresponding connecting pads 16 on the circuit board 15 through well-known connection means, such as solder balls 25. With the connections achieved as described, the semiconductor device 10 is mounted on the circuit board 15.

In the example illustrated, the mounting surface 20 of the anisotropically conductive film 14 is covered with an insulating film 26.

As shown in FIG. 4, the insulating film 26 covers the whole area of the mounting surface 20, excluding the connecting terminals 22, of the anisotropically conductive film 14, with the result that only the connecting terminals 22 of the wiring pattern 21 are exposed. Therefore, the insulating film 26 securely prevents moisture or any other foreign substances from entering the wiring pattern 21 and protects the wiring pattern from being damaged by foreign substances.

With the semiconductor device 10 according to the present invention, the connecting terminals 22 of the wiring pattern 21 on the anisotropically conductive film 14, which directly covers the electrodes 12 on the semiconductor chip 13, are connected to the connecting pads 16 on the circuit board 15. Because the semiconductor device 10 is mounted on the circuit board 15 by connecting the wiring pattern 21 to the circuit board 15, it becomes easy to handle the semiconductor device 10.

The anisotropically conductive film 14, while it covers the electrodes 12 on the semiconductor chip 13, permits a current to conduct between the electrodes 12 and the corresponding parts of the wiring pattern 21 on the anisotropically conductive film 14. This obviates the need for a filling material used in the prior art to protect the electrodes 12.

Because of the feature of the anisotropically conductive film 14 that conduction can be obtained at the local areas subjected to a strong pressure between the electrodes 12 of the semiconductor chip 13 and the wiring pattern 21, the present invention can be applied to down-sizing of the electrodes 12 attending on the general trend of miniaturization of semiconductor chips 13.

Moreover, when the semiconductor device is mounted, it is attached solidly to the circuit board 15 by the use of the wiring pattern 21 of the anisotropically conductive film 14 and therefore the interposer used in the prior art becomes unnecessary. Consequently, it becomes possible to simplify the configuration and provide a less expensive semiconductor device 19.

To reinforce the anisotropically conductive film 14, a reinforcing tape or the like may be attached to the anisotropically conductive film 14 when necessary.

<Embodiment 2>

As shown in FIG. 5, if the electrode 12 on the semiconductor chip 13 does not have such a sufficient extension from the mounting surface 11 of the semiconductor chip 13 as to apply a strong pressing force to a local area of the anisotropically conductive film 14 between the electrode 12 and the wiring pattern 21, then a raised portion 27 may be formed on the wiring pattern 21 so as to be closer to the electrode 12 on the semiconductor chip 13 to apply a necessary pressure to the anisotropically conductive film 14.

This raised can be formed with relative ease by using a mold corresponding in shape to the raised portion 27 when the anisotropically conductive film 14 having the wiring pattern 21 formed thereon is heated and pressed to the semiconductor chip 13.

<Embodiment 3>

Figure 6:
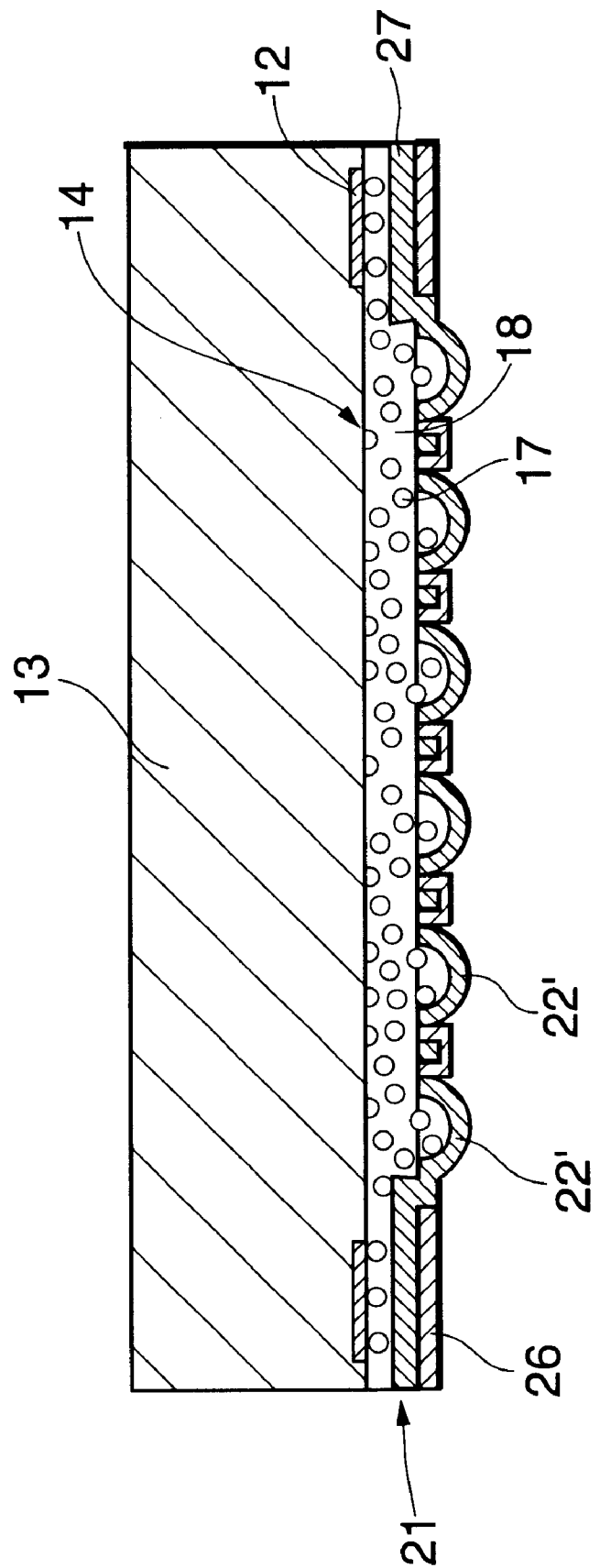
FIG. 6 is a drawing, similar to the one in FIG. 1, which shows yet another embodiment according to the present invention.

Further, as shown in FIG. 6, the connecting terminals 22 of the wiring pattern 21 may be formed as convex parts 22' protruding towards the connecting pads 16 on the circuit board 15.

This convex shape of the connecting terminals 22' ensures connection with the solder balls 25 when the semiconductor device 10 having the solder balls 25 as shown in FIG. 1 is mounted to the circuit board 15. Thus, the reliability of electric connection by solder can be improved.

As a synthetic resin material for the film main body 18 of the anisotropically conductive film 14, a thermosetting or ultraviolet-setting synthetic resin material may be used in place of the above-mentioned synthetic resin material.

The semiconductor device 10 according to the present invention can be efficiently produced by collectively forming many semiconductor chips 13 on a semiconductor wafer, solidly attaching a continuous sheet of anisotropically conductive film 14 to the semiconductor wafer, and splitting this combined body into individual semiconductor devices 10 by sawing.

Description has been made of examples in which the present invention is applied to the CSP type semiconductor device, but the present invention is not limited to those examples, but may be other types of semiconductor devices.

According to the present invention, as mentioned above, the mounting surface of the semiconductor chip is protected by an anisotropically conductive film solidly attached to the mounting surface, and the semiconductor chip and the conductive film are mounted to the circuit board through the connecting terminals of the wiring pattern on the anisotropically conductive mounting surface, the connecting terminals being electrically connectable to the connecting pads on the semiconductor chip by utilizing local conduction that occurs in the anisotropically conductive film. Therefore, it is unnecessary to use a filling material as in the prior art to protect the mounting surface of the semiconductor chip.

The anisotropically conductive film makes it easy to handle the semiconductor chip and also serves as backing for the semiconductor chip, for which reason the mounting board, which was required in the prior art, becomes unnecessary and the configuration of the semiconductor device can be simplified.

What is claimed is:

1. A semiconductor device comprising:
    a semiconductor chip having a mounting surface with electrodes mounted thereon; and
    a film having a gluing surface facing said mounting surface of said semiconductor chip and having a mounting surface for mounting to a circuit board, said mounting surface of said film being a surface opposite said gluing surface,
    said circuit board having connecting pads mounted thereon, wherein said film has on said mounting surface a wiring pattern formed thereon with connecting terminals connected to said connecting pads on said circuit board,
    said film is an anisotropically conductive film that exhibits conductivity at areas subjected to pressure between said wiring pattern and said electrodes of said semiconductor chip,
    said gluing surface of said film is attached solidly to said semiconductor chip with conductivity of said film being maintained by a hardening process of said film, and
    said mounting surface of said film and said wiring pattern are covered with an insulating film except for areas of said connecting terminals of said wiring pattern.

2. A semiconductor device according to claim 1, wherein said semiconductor device is a chip size package type semiconductor device.

3. A semiconductor device according to claim 1, wherein said connecting terminals of said wiring pattern are convex portions extending towards and connecting to said connecting pads on said circuit board, said convex portions being attached solidly to said connecting pads on said circuit board by solder.

4. A semiconductor device according to claim 1, wherein parts of said wiring pattern which correspond to said electrodes on said semiconductor chip are raised portions so as to be closer to said semiconductor chip, so that increased pressure is applied to said film.

5. A semiconductor device according to claim 1, wherein said wiring pattern is formed by transferring a wiring pattern of a conductive layer from a separable support film to said mounting surface of said film.

6. A semiconductor device according to claim 1, wherein said wiring pattern is formed by patterning a conductive layer formed on said mounting surface of said film.

7. A semiconductor device according to claim 1, wherein said anisotropically conductive film is a synthetic resin material with conductive particles dispersed therein.

8. A semiconductor device according to claim 1, wherein edge portions of said wiring pattern are covered by said insulating film.

9. A semiconductor device comprising:
   a semiconductor chip having a mounting surface with electrodes thereon; and
   a film having a gluing surface facing said mounting surface of said semiconductor chip and having a mounting surface for mounting to a circuit board, said mounting surface of said film being a surface opposite said gluing surface,
      said circuit board having connecting pads mounted thereon, wherein said film has on said mounting surface a wiring pattern formed thereon with connecting terminals connected to said connecting pads on said circuit board,
      said film is an anisotropically conductive film that exhibits conductivity at areas subjected to pressure between said wiring pattern and said electrodes of said semiconductor chip,
      said gluing surface of said film is attached solidly to said semiconductor chip with conductivity of said film being maintained by a hardening process of said film, and
      said connecting terminals of said wiring pattern are convex portions extending towards and being connected to said connecting pads on said circuit board by solder.

10. A semiconductor device according to claim 9, wherein said semiconductor device is a chip size package type semiconductor device.

11. A semiconductor device according to claim 9, wherein said mounting surface of said film and said wiring pattern are covered with an insulating film except for areas of said connecting terminals of said wiring pattern.

12. A semiconductor device according to claim 11, wherein edge portions of said wiring pattern are covered by said insulating film.

13. A semiconductor device according to claim 9, wherein parts of said wiring pattern which correspond to said electrodes on said semiconductor chip are raised portions so as to be closer to said semiconductor chip, so that increased pressure is applied to said film.

14. A semiconductor device according to claim 9, wherein said wiring pattern is formed by transferring a wiring pattern of a conductive layer from a separable support film to said mounting surface of said film.

15. A semiconductor device according to claim 9, wherein said wiring pattern is formed by patterning a conductive layer formed on said mounting surface of said film.

16. A semiconductor device according to claim 9, wherein said anisotropically conductive film is a synthetic resin material with conductive particles dispersed therein.

* * * * *